United States Patent [19]

Sater

[11] 4,245,768
[45] Jan. 20, 1981

[54] METHOD OF COLD WELDING USING ION BEAM TECHNOLOGY

[75] Inventor: Bernard L. Sater, Olmsted Falls, Ohio

[73] Assignee: The Unites States of America as represented by the Administrator of the National Aeronautics and Space Administration, Washington, D.C.

[21] Appl. No.: 929,084

[22] Filed: Jul. 28, 1978

[51] Int. Cl.³ .................... B23K 20/14; B23K 20/24
[52] U.S. Cl. ................................ 228/116; 228/205; 204/192 E
[58] Field of Search ............... 228/115, 116, 205, 206, 228/207, 220; 204/192 E; 34/1, 12

[56] References Cited

U.S. PATENT DOCUMENTS

| | | | |
|---|---|---|---|
| 3,500,532 | 3/1970 | Lozano | 228/116 |
| 4,101,772 | 7/1978 | Konishi et al. | 204/192 E X |

OTHER PUBLICATIONS

Sherwood et al., "The Effect of Vacuum Machining on the Cold Welding of Metals", Journal of the Institute of Metals, vol. 97, pp. 1-5, 1969.

Hudson et al., NASA Technical Memo X-3517, May 1977.

Chopra, K. L., *Thin Film Phenomena*, McGraw-Hill, 1969.

*Journal of Applied Physics*, vol. 38, No. 4, pp. 1896-1904, Mar. 15, 1967.

*Journal of Vacuum Science and Technology, The* vol. 4, No. 3, pp. 115-122, 1967.

*Primary Examiner*—Kenneth J. Ramsey
*Attorney, Agent, or Firm*—N. T. Musial; J. R. Manning; G. E. Shook

[57] ABSTRACT

A method for cold welding metal joints. In order to remove the contamination layer on the surface of the metal, an ion beam generator is used in a vacuum environment. A gas, such as xenon or argon, is ionized and accelerated toward the metal surface. The beam of gas effectively sputters away the surface oxides and contamination layer so that clean underlying metal is exposed in the area to be welded. The use of this method allows cold welding with minimal deformation. Both similar and dissimilar metals can be cold welded with this method.

14 Claims, 1 Drawing Figure

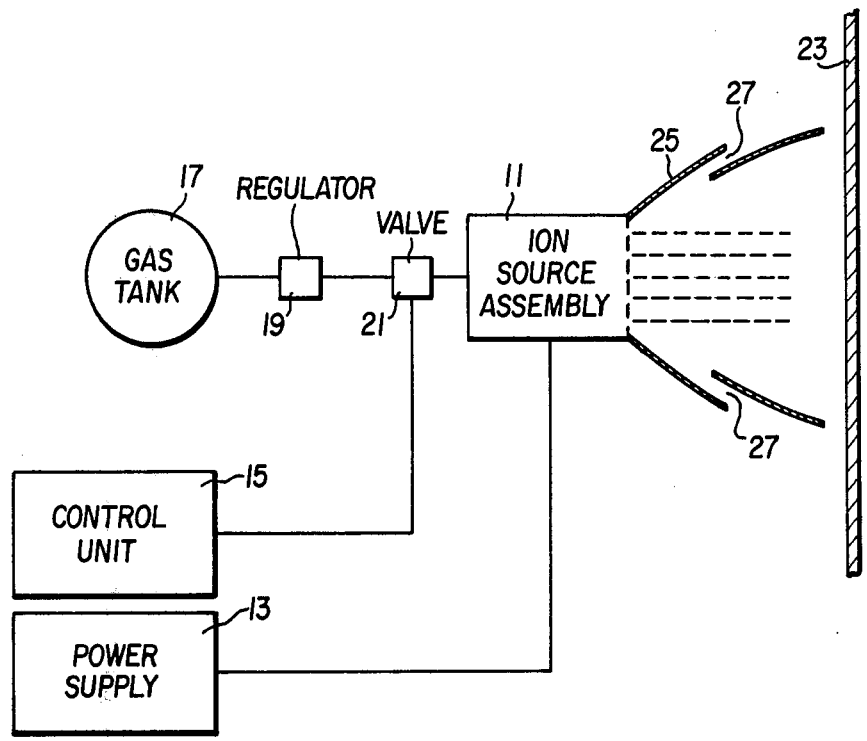

METHOD OF COLD WELDING USING ION BEAM TECHNOLOGY

ORIGIN OF THE INVENTION

The invention described herein was made by an employee of the United States Government and may be manufactured and used by or for the Government for Governmental purposes without the payment of any royalty thereon or therefor.

BACKGROUND OF THE INVENTION

1. Field of the Invention

The present invention relates generally to a process of welding metals, and more particularly to a process of cold welding metals using ion beams to prepare the surfaces of metals to be joined.

2. Description of the Prior Art

The fabrication of large structures in space will require reliable and efficient methods of joining metal structural members together. At the present time, aluminum is considered the prime construction material because of its cost, strength-to-weight relationship, and ease-of-fabrication properties. Welded joints are being considered. However, most conventional methods of welding involve a substantial amount of electric power for the formation of a molten metal zone and subsequent wetting of the metal interfaces to be joined, which adversely affects the mechanical properties. Thus the strength in the heat affected weld area is less than that of the unaffected parent metal. Although additional heat treatment after welding to restore some of the degraded mechanical properties is possible, it is undesirable because of time, energy, and equipment necessary.

Aluminum can also be joined by a process called cold welding. It is well known that if two perfectly clean (i.e., no oxide layer) and flat metal surfaces are brought into intimate contact ($\lesssim 0.25$ nm) with the atoms on these surfaces in registry, a solid state weld can occur. The normal interatomic forces of attraction which hold together the atoms of a single piece of metal will also hold the atoms in the bond made between the two separate pieces. Such bonds, in theory, will be as strong as those in the parent metal. To produce such a bond, referred to as cold welding, ideal mechanical and metallurgical conditions are required.

A typical metal surface on a microscopic scale consists of both large and small asperities which are generally covered with a film of oxides, nitrides, absorbed gasses, water vapor, organic and other contaminations. Before these surfaces can be cold welded, it is necessary to eliminate the contamination layer on the surfaces which prevents metal-to-metal bonding and to prevent recontamination of the clean surfaces prior to the welding operation. In addition, the mating surfaces are brought together under sufficiently high mechanical force to bring the atoms at the interface into intimate contact over a large portion of the area to be welded. Such pressure results in plastic flow at the high point of the asperities on the mating surface.

In conventional practice it is possible to achieve reliable cold welding in aluminum, as well as some other materials, for many applications by applying sufficient pressure to cause plastic flow of the material at the interface of the pieces to be welded. By using welding dies or indentors to cause plastic flow, the contamination oxide layers, which are normally more brittle than the parent metal, at the interface are broken up and dispersed allowing clean underlying metal to squeeze through to the interface for clean metal-to-metal bonding. Additionally, under plastic flow the atomic contact and registry between the two metals are greatly increased. Thus a good solid state weld is formed. Tests show that the best conventional cold welds in aluminum assemblies occur at about 60% deformation.

Such plastic flow and deformation, however, has several drawbacks. First, the temper of the metal is increased by cold working in the bond area so that it is less ductile than the parent metal and, second, the strength of the bond will eventually equal the strength of the thinned metal caused by the deformation.

Experimenters have investigated cold welding phenomena in clean vacuum environments largely to support studies of friction, wear, and lubrication of spacecraft materials. Various methods to obtain clean surfaces were employed, such as fracturing the material, wire brushing the surfaces, and etching with DC and RF plasmas. Thereafter these surfaces were forced together with sufficient loading pressure to bring surface asperities into intimate contact. The data shows that the resultant bond is strongly influenced by the specific nature and amount of contamination. As little as one or two monolayers of metallic oxides effectively interrupt or prevent metallic bonding.

Physically or chemically absorbed layers, such as oxides, are present on even the cleanest metal surfaces in normal atmosphere and a surface that is cleaned at one atmosphere ($\sim 760$ torr) pressure will be recontaminated by a monolayer in less than $10^{-8}$ seconds. However, in a vacuum pressure of $10^{-6}$ torr, the recontamination time is on the order of a few seconds and the time to recontaminate progressively increases as the vacuum pressure decreases. Unfortunately, the tenacity with which oxide monolayers as well as other highly active materials are attached to most metal surfaces make them stable at vacuum levels well below their bulk vapor pressure. Therefore, an effective cleaning method must be employed to completely remove the contamination layer even in good vacuum environments.

BRIEF SUMMARY OF THE INVENTION

It is therefore one object of the present invention to provide an improved method of cold welding metals in a vacuum environment.

It is another object of this invention to provide such a method of cold welding in which the contamination layers on the metal surfaces to be joined are effectively removed.

It is yet another object of this invention to provide such a method of cold welding which avoids gross deformation and thinning of the material at the weld.

It is yet another object of this invention to provide such a method of cold welding which avoids the formation of intermetallic compounds at the weld interface between dissimilar metals.

The objects of the present invention are achieved by using ion beam technology to facilitate in the removal of the contamination layer. The method comprises the steps of providing two metal surfaces to be joined, each surface having asperities and covered with a contamination oxide layer; disposing the two surfaces in a vacuum environment; directing a unidirectional beam of gas molecules having uniform energies onto each surface to sputter away the contamination oxide layer and expose clean underlying metal; and pressing together the two surfaces with pressure sufficient that their asperities are brought into intimate contact to form a cold welded joint. The use of the ion beam in a vacuum exposes clean metal surfaces that are amenable to cold welding upon application of clamping pressures sufficiently high to bring a large portion of the atoms of each surface at the weld interface into intimate contact but sufficiently low as not to cause the problems of gross deformation and cold work hardening as with conventional cold welding. Thus, the result is greatly improved cold welding useful for the fabrication of large space structures as one specific example. This invention can be employed in many other applications, including terrestrial applications such as the welding of electric connections in processing of semiconductors and the welding of dissimilar metals.

There are several major advantages of an ion source using ion beam technology over conventional sputtering methods such as DC discharge and RF plasma as follows: (1) precise control of the beam configuration, size and density is possible; (2) a uniform energy to all particles in the beam is provided; (3) it can be directed at and confined to the surface area to be cleaned; (4) its unidirectional flow of expellant gas provides continuous purging in the region being cleaned to minimize recontamination by the gaseous products that may result during cleaning; (5) the ion source can operate in a wide range of background vacuum pressures and more specifically in a much lower vacuum pressure environment; (6) cleaning can be accomplished up to the time of joining; and (7) the energy in the beam is imparted to the work piece, to a large extent, so that a degree of heating aids outgassing of any trapped gases and improve bonding.

The foregoing as well as other objects, features and advantages of the present invention will become more apparent from the following detailed description taken in conjunction with the appended drawings.

BRIEF DESCRIPTION OF THE DRAWINGS

The FIGURE is a schematic diagram of an ion beam apparatus for carrying out a process of cold welding according to the invention.

DESCRIPTION OF THE PREFERRED EMBODIMENTS

Referring to the FIGURE, there is illustrated a schematic diagram of an ion beam apparatus configured in accordance with this invention. The basic system is conventional and consists of an ion source assembly 11, its power supply 13, an expellant gas source, a control unit 15 and a vacuum environment. Typically the expellant, an inert gas such as xenon or argon for example, is stored in a high pressure tank 17 and delivered to the ion source assembly 11. In a typical system a regulator 19 and valve 21 can be employed, as shown. The construction of the ion source assembly 11 is discussed in the paper, W. R. Hudson, R. R. Robson and J. S. Sovey, NASA TM X-3517, May 1977, NASA, Washington, D.C., herewith incorporated by reference. Ion beam technologies developed primarily for space ion thrusters are utilized in this invention for ion generation, ion optics, ion acceleration and neutralization of the expellant gas. The ion source produces a unidirectional beam of inert gas molecules with uniform energies of the order of 1 to 2 keV depending on the accelerating potential applied. This beam, directed onto each surface 23 to be cleaned, effectively sputters away the contamination oxide layer to expose clean underlying metal. When the surfaces to be joined are sufficiently clean and prior to their being recontaminated by the environment, they are pressed together with pressure adequate to assure that their asperities are brought into intimate contact throughout the area to be joined. This process provides a solid state cold weld with metal-to-metal bonding without causing gross deformation due to plastic flow and thinning of the material at the joint.

Also shown in the FIGURE are a shield 25 that traps the sputtered material that is removed from the surfaces being cleaned, and vents 27 for the expellant and other gaseous products that may result during the cleaning operation to be dumped into the space environment. These elements may or may not be necessary depending on the actual application and other requirements.

Experimental cold welding using ion beam technology to prepare surfaces to be joined has been successfully demonstrated in a vacuum tank with background pressures of $10^{-4}$ to $10^{-6}$ torr. The following welds have been demonstrated: aluminum-to-aluminum, copper-to-copper, aluminum-to-copper, soft-aluminum-to-tempered-aluminum, nickel-to-copper alloy and silver-to-iron. The cold welding of silver-to-iron is unique because these metals are insoluble in each other and do not form an intermediate metallic compound phase. This observation would tend to confirm that adhesion energies and electronic barriers at the interface between the materials play an important role in cold welding using ion beam technology. The use of ion beam cleaning to obtain high quality cold welds with minimal deformation is discussed in a paper, R. L. Sater and T. J. Moore, NASA TM-78933, June 1978, NASA, Washington, D.C. incorporated herein by reference.

Cold welding has been defined as a welding process in which the temperatures of the surfaces to be mated are low relative to the melting point of the materials, for example, 0.1 to 0.5 $T_m$, where $T_m$ is the melting point of the material in degrees Kelvin. Cold welding has also been referred to as warm welding in this temperature range.

For comparison, it should be noted that in conventional diffusion bonding, the surfaces are mated at a very high temperature (0.8 to 0.9 $T_m$) under a load high enough to produce plastic deformation at the surfaces, which in turn ruptures the oxide film, followed by the creation of metallic bonds by diffusion and grain growth across the original interface. In ion beam technology cold welding, it may not be possible to create grain growth across the original interface because the temperature may not be high enough for atom movement and diffusion, but good solid state bonding will nevertheless be obtained. However, subsequent heating after cold welding will permit grain growth across the original interface.

Furthermore, it should be noted that conventional diffusion bonding of most dissimilar metals has several problems which are often encountered because of the high temperatures involved. For examples: (1) intermetallic compound phases may form at the weld interface which are often more brittle than either parent metals; (2) there may be distortions due to thermal expansion and shrinkage stresses and (3) there may be undesirable material property changes due to recrystallization. These problems are eliminated with the ion beam cold welding method of this invention.

Obviously, numerous additional modifications and variations of the present invention are possible in light of the above teachings. For example, it should be understood that the expellant gas does not have to be limited to inert gases. Metal vapor, such as Hg, high reactive gases such as $F_2$ or compounds, such as freon, can be employed depending upon many factors including one's desire to cause surface reactions or not in the process of sputtering. It is therefore to be understood that within the scope of the appended claims, the invention may be practiced otherwise than as specifically described herein.

What is claimed as new and desired to be secured by Letters Patent of the United States is:

1. A method of cold welding using ion beam technology to prepare surfaces to be joined comprising the steps of:
   providing two metal surfaces to be joined, each surface having asperities and covered with a contamination oxide layer;
   disposing the two surfaces in a vacuum environment at a pressure between $10^{-4}$ and $10^{-6}$ torr;
   directing a unidirectional ion beam of gas molecules having uniform energies onto each surface in said vacuum environment to sputter away the contamination oxide layer and expose clean underlying metal; and
   pressing together the two surfaces while in said vacuum prior to their being recontaminated with pressure sufficient that their asperities are brought into intimate contact but sufficiently low as not to produce gross deformation and cold work hardening to form a cold welded joint.

2. The method of cold welding recited in claim 1 wherein the providing step includes:
   providing two aluminum surfaces to be joined, each surface having asperities and covered with a contamination oxide layer.

3. The method of cold welding recited in claim 1 wherein the providing step includes:
   providing two copper surfaces to be joined, each surface having asperities and covered with a contamination oxide layer.

4. The method of cold welding recited in claim 1 wherein the providing step includes:
   providing an aluminum surface and a copper surface to be joined, each surface having asperities and covered with a contamination oxide layer.

5. The method of cold welding recited in claim 1 wherein the providing step includes:
   providing a soft aluminum surface and a tempered aluminum surface to be joined, each surface having asperities and covered with a contamination oxide layer.

6. The method of cold welding recited in claim 1 wherein the directing step includes:
   directing a unidirectional beam of inert gas molecules having uniform energies onto each surface to sputter away the contamination oxide layer and expose clean underlying metal.

7. The method of cold welding recited in claim 1 wherein the directing step includes:
   directing a unidirectional beam of xenon gas molecules having uniform energies onto each surface to sputter away the contamination oxide layer and expose clean underlying metal.

8. The method of cold welding recited in claim 1 wherein the directing step includes:
   directing a unidirectional beam of argon gas molecules having uniform energies onto each surface to sputter away the contamination oxide layer and expose clean underlying metal.

9. The method of cold welding recited in claim 1 wherein the directing step includes:
   directing a unidirectional beam of metal vapor molecules having uniform energies onto each surface to sputter away the contamination oxide layer and expose clean underlying metal.

10. The method of cold welding recited in claim 1 wherein the directing step includes:
    directing a unidirectional beam of Hg vapor molecules having uniform energies onto each surface to sputter away the contamination oxide layer and expose clean underlying metal.

11. The method of cold welding recited in claim 1 wherein the directing step includes:
    directing a unidirectional beam of high reaction gas molecules having uniform energies onto each surface to sputter away the contamination oxide layer and expose clean underlying metal.

12. The method of cold welding recited in claim 1 wherein the directing step includes:
    directing a unidirectional beam of $F_2$ gas molecules having uniform energies onto each surface to sputter away the contamination oxide layer and expose clean underlying metal.

13. The method of cold welding recited in claim 1 wherein the directing step includes:
    directing a unidirectional beam of gaseous compound molecules having uniform energies onto each surface to sputter away the contamination oxide layer and expose clean underlying metal.

14. The method of cold welding recited in claim 1 wherein the directing step includes:
    directing a unidirectional beam of freon gas molecules having uniform energies onto each surface to sputter away the contamination oxide layer and expose clean underlying metal.

* * * * *